(12) United States Patent
Chang et al.

(10) Patent No.: US 7,615,861 B2
(45) Date of Patent: Nov. 10, 2009

(54) METHODS OF PROMOTING ADHESION BETWEEN TRANSFER MOLDED IC PACKAGES AND INJECTION MOLDED PLASTICS FOR CREATING OVER-MOLDED MEMORY CARDS

(75) Inventors: Che-Jung Chang, Dali (TW); Chin-Tien Chiu, Taichung (TW); Cheemen Yu, Madison, WI (US); Hem Takiar, Fremont, CA (US); Jack Chang Chien, Kaoshiung (TW); Ning Liu, Shenzhen (CN)

(73) Assignee: SanDisk Corporation, Milpitas, CA (US)

( * ) Notice: Subject to any disclaimer, the term of this patent is extended or adjusted under 35 U.S.C. 154(b) by 263 days.

(21) Appl. No.: 11/373,941

(22) Filed: Mar. 13, 2006

(65) Prior Publication Data
US 2007/0210444 A1 Sep. 13, 2007

(51) Int. Cl.
*H01L 23/12* (2006.01)
(52) U.S. Cl. .............. 257/704; 257/E23.182; 257/706; 257/707; 361/72; 361/74
(58) Field of Classification Search ............ 257/704, 257/678, 797, 787, E21.504, E23.124, 706, 257/707, 720, E23.181, E23.182; 174/52.1, 174/52.2; 361/386, 72, 74, 81
See application file for complete search history.

(56) References Cited
U.S. PATENT DOCUMENTS

| | | | | |
|---|---|---|---|---|
| 5,309,026 A | * | 5/1994 | Matsumoto | 257/787 |
| 5,406,117 A | * | 4/1995 | Dlugokecki et al. | 257/659 |
| 5,825,042 A | * | 10/1998 | Strobel et al. | 250/515.1 |
| 6,433,420 B1 | * | 8/2002 | Yang et al. | 257/712 |
| 6,777,819 B2 | * | 8/2004 | Huang | 257/796 |
| 2003/0000722 A1 | * | 1/2003 | Hoffman et al. | 174/52.1 |
| 2003/0080441 A1 | | 5/2003 | Bolken | |
| 2004/0155329 A1 | * | 8/2004 | Sur et al. | 257/704 |

FOREIGN PATENT DOCUMENTS

JP 2003099747 A 4/2003

OTHER PUBLICATIONS

International Search Report, Application No. PCT/US2007/006234.
International Preliminary Report and Written Opinion dated Sep. 25, 2007. in PCT Application No. PCT/US2007/006234.

* cited by examiner

*Primary Examiner*—Chris C Chu
(74) *Attorney, Agent, or Firm*—Vierra Magen Marcus & DeNiro LLP

(57) ABSTRACT

A flash memory card and methods of manufacturing same are disclosed. The card includes a semiconductor package fabricated to receive a single-sided or double-sided lid. A surface of the semiconductor package may be formed with holes, trenches and/or pockmarks. After the holes, trenches and/or pockmarks are formed, a lid may be attached to the package surface in an injection molding process. During the injection molding process, the molten plastic flows into the holes, trenches and/or pockmarks to interconnect with the surface of the semiconductor package. Thus, when the molten plastic hardens, the holes, trenches and/or pockmarks ensure that the lid remains firmly attached to semiconductor package.

9 Claims, 11 Drawing Sheets

(Line 4-4)

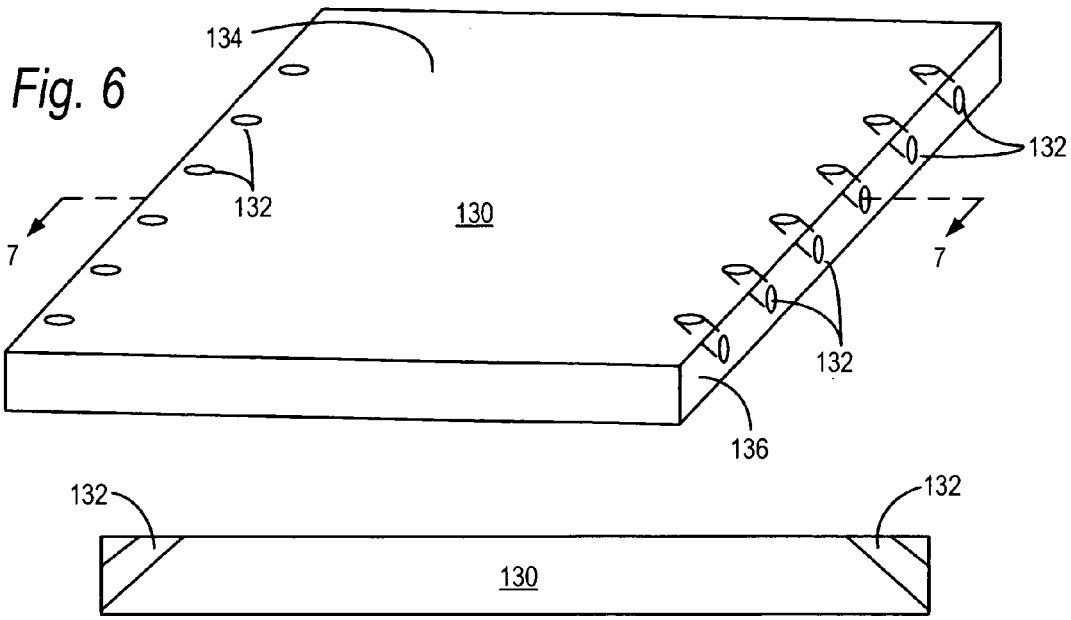
*Fig. 6*
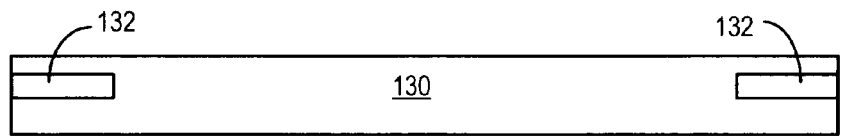
*Fig. 7*
*(Line 7-7)*
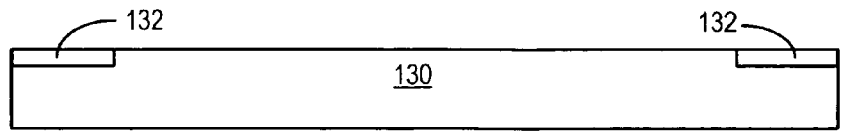
*Fig. 7A*
*Fig. 7B*
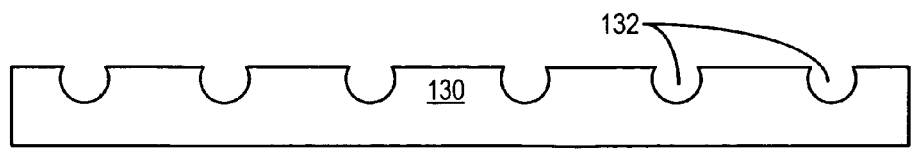
*Fig. 7C*

Fig. 13
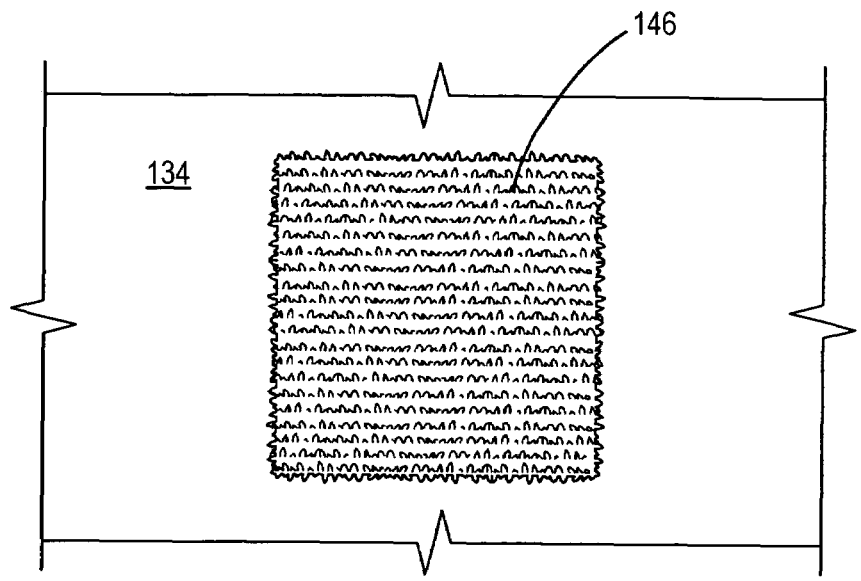
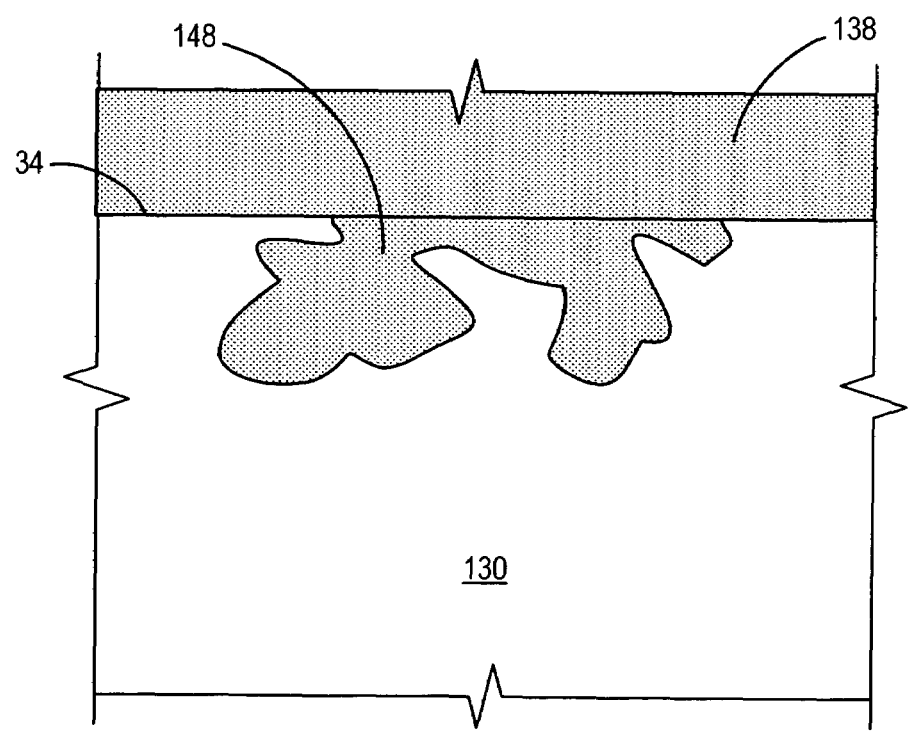
Fig. 14

METHODS OF PROMOTING ADHESION BETWEEN TRANSFER MOLDED IC PACKAGES AND INJECTION MOLDED PLASTICS FOR CREATING OVER-MOLDED MEMORY CARDS

BACKGROUND OF THE INVENTION

1. Field of the Invention

Embodiments of the present invention relate to methods of manufacturing a semiconductor package.

2. Description of the Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While a wide variety of packaging configurations are known, flash memory storage cards may in general be fabricated as system-in-a-package (SiP) or multichip modules (MCM), where a plurality of die are mounted on a substrate. The substrate may in general include a rigid base having a conductive layer etched on one or both sides. Electrical connections are formed between the die and the conductive layer(s), and the conductive layer(s) provide an electric lead structure for integration of the die into an electronic system. Once electrical connections between the die and substrate are made, the assembly is then typically encased in a molding compound in a transfer molding process to provide a protective package.

In view of the small form factor requirements, as well as the fact that flash memory cards need to be removable and not permanently attached to a printed circuit board, such cards are often built of a land grid array (LGA) package. In an LGA package, the semiconductor die are electrically connected to exposed contact fingers formed on a lower surface of the package. External electrical connection with other electronic components on a host printed circuit board (PCB) is accomplished by bringing the contact fingers into pressure contact with complementary electrical pads on the PCB. LGA packages are ideal for flash memory cards in that they have a smaller profile and lower inductance than pin grid array (PGA) and ball grid array (BGA) packages.

Semiconductor die are typically batch processed on a panel and then singulated into individual packages upon completion of the fabrication process. Several methods are known for singulating the semiconductor packages including, for example, sawing, water jet cutting, laser cutting, water guided laser cutting, dry media cutting and diamond coated wire cutting.

Once singulated, fabrication of the flash memory card may be completed by encasing a semiconductor package within a pair of lids. The lids protect the package, as well as cover contacts pads, such as test pads that are left exposed in the package through the molding to allow for electrical test and burn-in after the package has been completed. It is also known to provide only a single lid, on one side of the package, to protect the package and cover exposed contact pads.

The one or two lids are typically affixed to the package in an injection molding process. One difficulty in affixing single-sided lids is that the single-sided lid formed in the injection molding process does not adhere well to the outer surface of the molding compound of the package formed in the transfer molding process. One solution has been to form a card 20 as shown in prior art FIG. 1, including a semiconductor package 22 and a lid 24 which partially wraps around the opposite side of the package. The wrap around configuration disadvantageously increases the overall thickness of the finished semiconductor card.

SUMMARY OF THE INVENTION

Embodiments of the present invention relate in general to a flash memory card including a semiconductor package fabricated to receive a single-sided or double-sided lid, and methods of manufacturing same. In one embodiment, after singulation of a semiconductor package from a panel of semiconductor packages, a plurality of holes may be formed in an upper surface of the semiconductor package and out of the side edges of the semiconductor package. The holes may be formed through the package molding compound and do not interfere with the electrical function of the package. After the holes are formed, a lid may be attached to the package in an injection molding process. During the injection molding process, the molten plastic flows into and through the holes. Thus, when the molten plastic hardens, the plastic-filled holes ensure that the lid remains firmly attached to the semiconductor package.

In a further embodiment, the molding compound surface of the semiconductor package may be scored with a laser so as to create rough, pock-marked areas on the surface of the package. When the lid is injection molded onto the semiconductor package, the molten plastic will fill the pockmarks formed by the laser. The mating interconnection of the molten plastic with the pock-marked surface affixes the lid to the semiconductor package.

In another embodiment of the present invention, a plurality of trenches may be formed in the surface of the semiconductor package. The trenches may be undercut so as to be wider at the bottom of the trench than at the outer surface. Thus, during the injection molding process for attaching the lid, the molten plastic flows into the trenches with the undercuts serving to lock the lid to the semiconductor package upon hardening of the molten plastic. The trenches may be discretely formed shapes in the surface of the semiconductor packages, such as for example squares, rectangles or other shapes. Alternatively, the trenches may be formed in rows extending across the surface, or a portion of the surface, of the semiconductor package.

In another embodiment of the present invention, instead of cutting into the surface of the semiconductor package, a compound may be applied to the surface of the semiconductor package which is capable of affixing the lid to the semiconductor package. The compound may be a variety of known adhesives, such as for example an adhesive film, a glue or a heat-activated chemical adhesive.

BRIEF DESCRIPTION OF THE DRAWINGS

FIG. 6 is a perspective view of a semiconductor package including holes for receiving molten plastic during the injection molding process for affixing a lid onto the semiconductor package.

FIG. 7 is a cross-sectional view of the package shown FIG. 6.

FIGS. 7A through 7C are a further alternative embodiment including holes formed parallel to the surface of the semiconductor package.

FIG. 13 is a top view of a semiconductor package scored with a laser to include rough, pock-marked sections.

FIG. 14 is a side view of the semiconductor package shown in FIG. 13.

DETAILED DESCRIPTION

Embodiments of the invention will now be described with reference to FIGS. 2 through 21 which relate to a flash memory card including a semiconductor package fabricated to receive a single-sided or double-sided lid, and methods of manufacturing same. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

Figure 1:
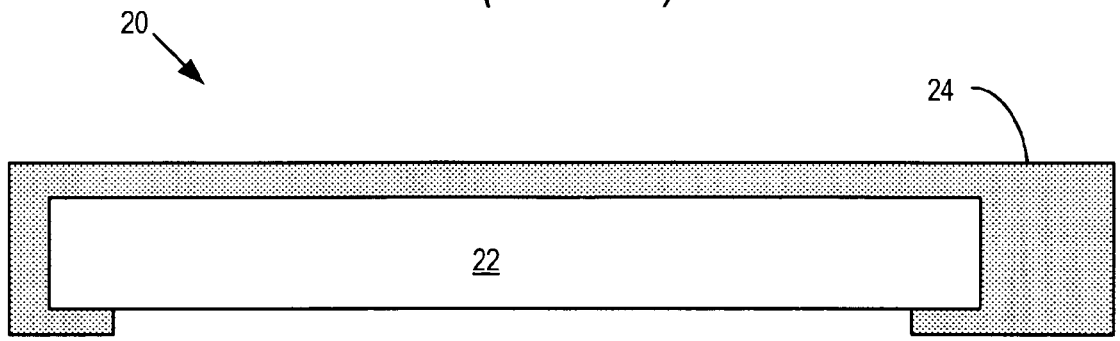
FIG. 1 is a side view of a conventional wrap-around lid for a flash memory card.
Figure 2:
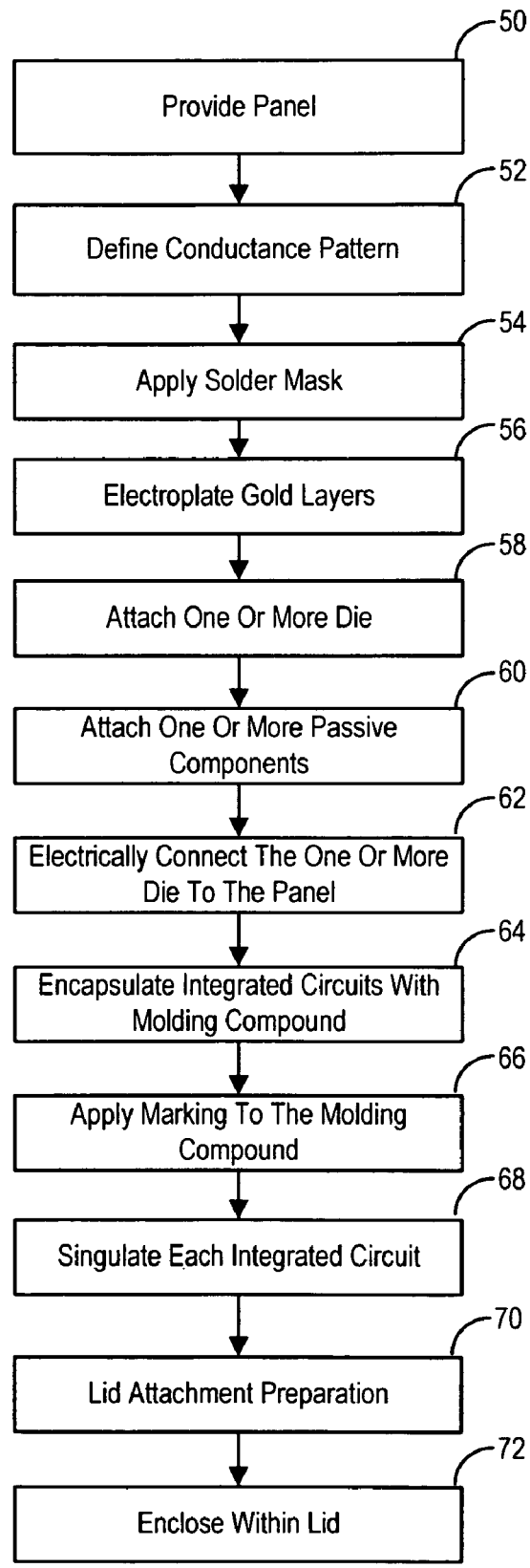
FIG. 2 is a flowchart of the method of fabricating a flash memory card according to embodiments of the present invention.
Figure 4:
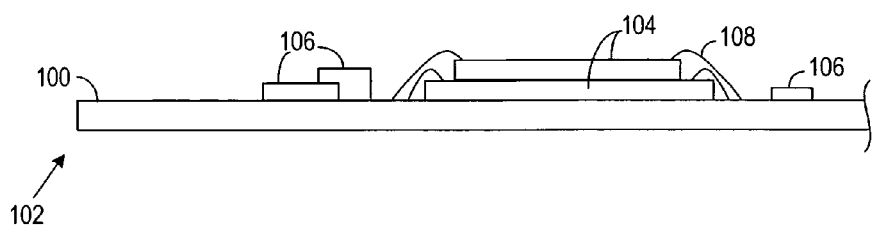
FIG. 4 is a cross-sectional view through line 4-4 in FIG. 3.
Figure 3:
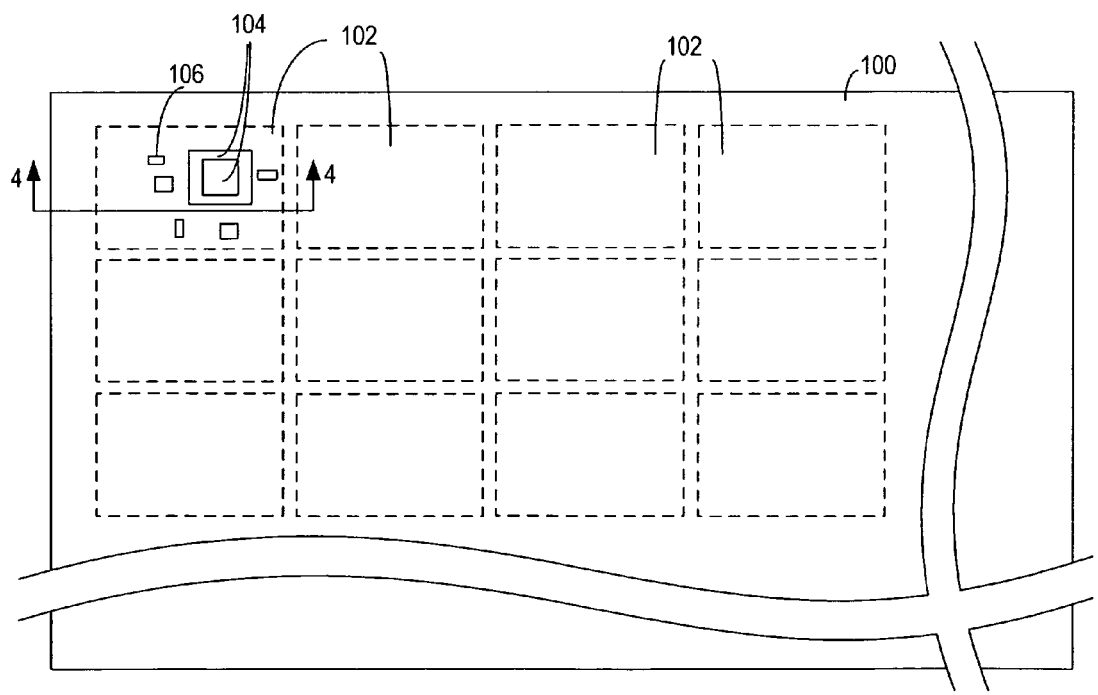
FIG. 3 is a top view of a portion of a panel of integrated circuits during the fabrication process according to the present invention.

In general, semiconductor packages according to the present invention are formed in a process described with respect to FIG. 1. The fabrication process begins in step 50 with a panel 100, shown partially for example in FIGS. 3 and 4. The type of panel 100 used in the present invention may for example be a leadframe, printed circuit board ("PCB"), a tape used in tape automated bonding ("TAB") processes, or other known substrates on which integrated circuits may be assembled and encapsulated.

In embodiments where panel 100 is a PCB, the substrate may be formed of a core, having a top conductive layer formed on a top surface of the core, and a bottom conductive layer formed on the bottom surface of the core. The core may be formed of various dielectric materials such as for example, polyimide laminates, epoxy resins including FR4 and FR5, bismaleimide triazine (BT), and the like. The conductive layers may be formed of copper or copper alloys, plated copper or plated copper alloys, Alloy 42 (42Fe/58Ni), copper plated steel, or other metals and materials known for use on substrates.

The metal layers of panel 100 may be etched with a conductance pattern in a known process for communicating signals between one or more semiconductor die and an external device (step 52). Once patterned, the substrate may be laminated with a solder mask in a step 54. In embodiments where substrate 100 is used for example as an LGA package, one or more gold layers may be formed on portions of the bottom conductive layer in step 56 to define contact fingers on the bottom surface of the semiconductor package as is known in the art for communication with external devices. The one or more gold layers may be applied in a known electroplating process. It is understood that the semiconductor package according to the present invention need not be an LGA package, and may be a variety of other packages in alternative embodiments including for example BGA packages.

A plurality of discrete integrated circuits 102 may be formed on panel 100 in a batch process to achieve economies of scale. The fabrication of integrated circuits 102 on panel 100 may include the steps 58 and 60 of mounting one or more semiconductor die 104 and passive components 106 on panel 100 for each integrated circuit 102.

The one or more semiconductor die 104 may be mounted in step 58 in a known adhesive or eutectic die bond process, using a known die-attach compound. The number and type of semiconductor die 104 are not critical to the present invention and may vary greatly. In one embodiment, the one or more die 104 may include a flash memory array (e.g., NOR, NAND or other), S-RAM or DDT, and/or a controller chip such as an ASIC. Other semiconductor die are contemplated. The one or more die 114 may be electrically connected to panel 100 by wire bonds 108 in step 62 in a known wire-bond process. The die may be stacked in an SiP arrangement, mounted side-by-side in an MCM arrangement, or affixed in another packaging configuration.

Although not specifically called out on the flowchart of FIG. 1, various visual and automated inspections may be made during the above-described fabrication of the plurality of integrated circuits 102 on panel 100.

Figure 5:
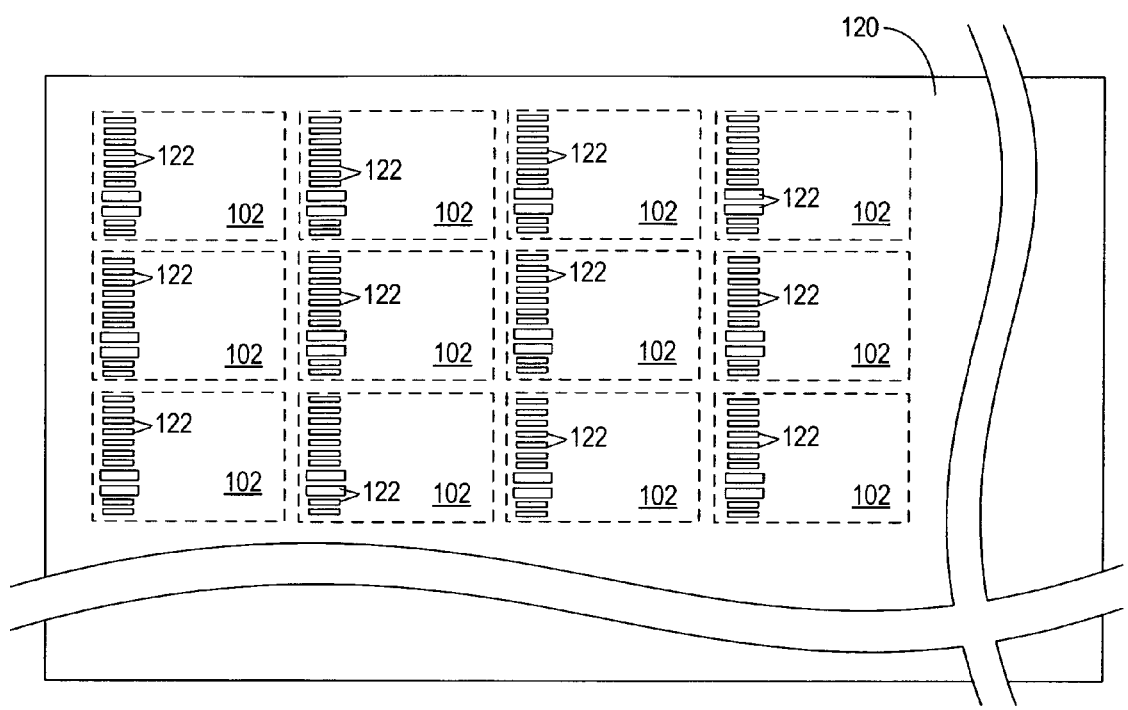
FIG. 5 is a top view of a panel of molded integrated circuits according to embodiments of the present invention prior to being cut into individual integrated circuit packages.

Once the plurality of integrated circuits 102 have been formed on panel 100, each of the integrated circuits 102 may be encapsulated with a molding compound 120 in step 64 and as shown in FIG. 5. As is known in the art, molding compound 120 may include various compounds such as epoxy, hardener, silicon dioxide and other organic compounds, and may be available for example from Sumitomo Corp. and Nitto Denko Corp., both having headquarters in Japan. Other molding compounds from other manufacturers are contemplated. The molding compound may be applied according to various processes, including by transfer molding, to encapsulate each of the integrated circuits 102. As shown in FIG. 5, contact fingers 122 may be left exposed.

In the transfer molding process, the panel 100 is placed in a mold and liquid molding compound is then flowed into the mold and around the panel. After hardening sufficiently to be removed from the mold, the encapsulated panel may then be cured, for example in an oven at 175° for 5 hours, to permanently set the molding compound. The curing process may be performed under different temperature and time conditions in alternative embodiments.

Although shown with a generic rectangular shape in FIG. 5, the molded integrated circuits may have irregular and/or curvilinear shapes in embodiments. A method for forming irregular shaped semiconductor packages is disclosed for example in U.S. patent application Ser. No. 11/265,337, entitled "Method of Manufacturing Flash Memory Cards," which application is assigned to the owner of the present application and which application is incorporated by reference herein in its entirety.

After molding step 64, a marking can be applied to the molding compound 120 in step 66. The marking may for example be a logo or other information printed on the surface of the molding compound 120 for each integrated circuit 102. The marking may for example indicate manufacturer and/or type of device. Marking step 66 may be omitted in alternative embodiments of the present invention.

Each of the integrated circuits 102 may next be singulated in step 68. Singulation step 68 involves cutting integrated circuits 102 on panel 100 into a plurality of individual semiconductor packages. Known cutting devices include, for example, water jet cutting, laser cutting, water guided laser cutting, dry media cutting, and diamond coated wire cutting. Water can also be used together with laser cutting to help complement or focus its effects. As is known in the art, the above cutting methods are able to achieve sophisticated rectilinear and/or curvilinear shapes of the individualized integrated circuit packages. A further description of the cutting of integrated circuits from a panel and the shapes which may be achieved thereby is disclosed in U.S. Publication No. 2004/0259291, entitled, "Method For Efficiently Producing Removable Peripheral Cards," which application is incorporated by reference herein in its entirety. It is understood that the singulated integrated circuits may be formed by other processes than that described above in alternative embodiments.

As explained in the Background of the Invention section, injection-molded lids do not adhere well to transfer-molded epoxy compounds forming the outer surfaces of semiconductor packages. Therefore, in accordance with the present invention, a lid attachment preparation step 70 may be performed to form one or more features in a surface of the molding compound to prepare the semiconductor package to more securely receive a lid which is affixed to one or two sides of the package.

A first embodiment of the lid attachment preparation step 70 is shown in the perspective and cross-sectional views of FIGS. 6 and 7, respectively. After singulation of a semiconductor package 130 in step 68, features in the form of a plurality of holes 132 may be formed obliquely down through a surface 134 of the semiconductor package and out of the side edges 136 of the semiconductor package as shown. The holes 132 may be formed through the molding compound 120, and possibly through the package substrate, provided the holes do not interfere with electrical circuit(s) defined on the substrate or the electrical function of the package 130.

In embodiments, the holes 132 may have a diameter of approximately 0.25 millimeters, and be spaced apart from each other approximately one millimeter. It is understood that the diameter of holes 132 may be larger or smaller than 0.25 millimeters, and the spacing between holes 132 may be larger or smaller than one millimeter in alternative embodiments of the present invention. The holes 132 may be formed in molding compound 120 by various known processes such as, for example, with a mechanical drill or a laser. The holes may be formed around one, two, three or all four side edges of the semiconductor package 130.

The holes 132 may be formed at an angle of approximately 45°, but the angle may be more or less than 45° in alternative embodiments. In a further alternative embodiment shown in FIGS. 7A through 7C, instead of holes 132 being drilled at an angle through the top surface 134 and side edges 136, the holes 132 may be drilled through the side edges 136 parallel to the surface 134 of the semiconductor package 130 as shown in FIG. 7A. In such an embodiment, the holes 132 may be drilled between the surface 134 and the opposed surface so as not to break through the surface 134 or opposed surface. Alternatively, the drilled holes may be parallel to the surface 134, but break the surface 134 as shown in FIGS. 7B and 7C. In the embodiments shown in FIGS. 7B and 7C, the longitudinal axis of holes 132 are preferably below the surface 134 so that the holes 132 have an arclength of greater than 180°. In the embodiments of FIGS. 7A through 7C, the holes may be formed to a desired length within the package 130, such as, for example, one to four millimeters.

Holes 132 may be circular. In alternative embodiments, as opposed to holes 132 being circular, holes 132 may be slots may be formed through the surface 134 of package 130 and out of the side edges 136. Alternatively, the slots may be formed into the side edges 136 and parallel to the surface 134, as in the holes 132 of FIGS. 7A through 7C.

Figure 8:
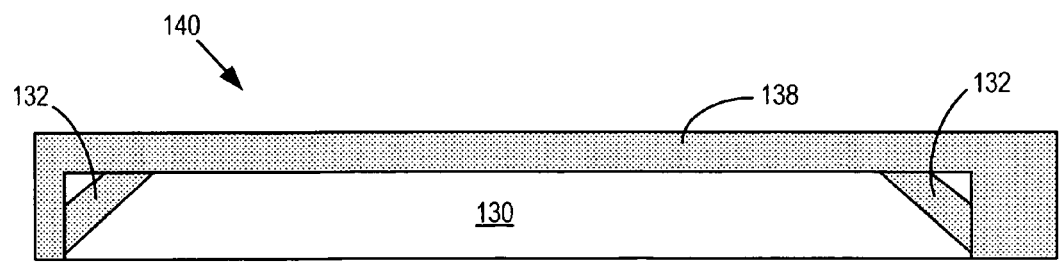
FIG. 8 is a cross-sectional view similar to FIG. 7 and further showing a lid affixed to the semiconductor package.

Referring again to the flowchart of FIG. 1 and the cross-sectional view of FIG. 8, a semiconductor package 130 formed as described above may further be enclosed within an external lid 138 in a step 72 to form a finished flash memory card 140. The lid 138 may provide an external covering for the semiconductor package and establish external product features (for example including any notches, chamfers, etc. to aid in proper insertion of the card 140 in a host device). Lid 138 may be formed of various plastics as is known in the art, such as for example, polycarbonate, and may be affixed to package 130 in various processes as is known in the art, such as for example, injection molding.

In an injection molding process, the package 130 may be placed within a mold, and then molten plastic may be flowed over surface 134 and side edges 136 under high pressure and temperature. As seen in FIG. 8, during the injection molding process, the molten plastic flows into and through holes 132. Thus, when the molten plastic hardens, the plastic-filled holes 132 ensure that lid 138 remains firmly attached to semiconductor package 130. As shown in FIG. 8, the lid 138 may be a single-sided lid, affixed to surface 134 and surrounding side edges 136, with the remaining package surface being uncovered. In further embodiments, the lid 138 may completely enclose all of the surfaces of the semiconductor package 130. In such embodiments, the lid may be formed of a single unitary piece surrounding the package 130, or in two parts which are adhered to each other and which together enclose the semiconductor package 130.

As indicated above, the embodiment of the present invention shown in FIGS. 6 through 8 is one of many possible embodiments for enhancing the attachment of lid 138 to semiconductor package 130. FIGS. 9 through 12 show further embodiments including holes 132 formed through a semiconductor package 130 which has tapered or stepped side edges. Further details of a semiconductor package having tapered or stepped edges and a lid therefore are described in U.S. patent application Ser. No. 11/356,276, entitled "A SIP Module With a Single Sided Lid," filed Feb. 15, 2006, which application is incorporated herein by reference in its entirety.

Figure 9:
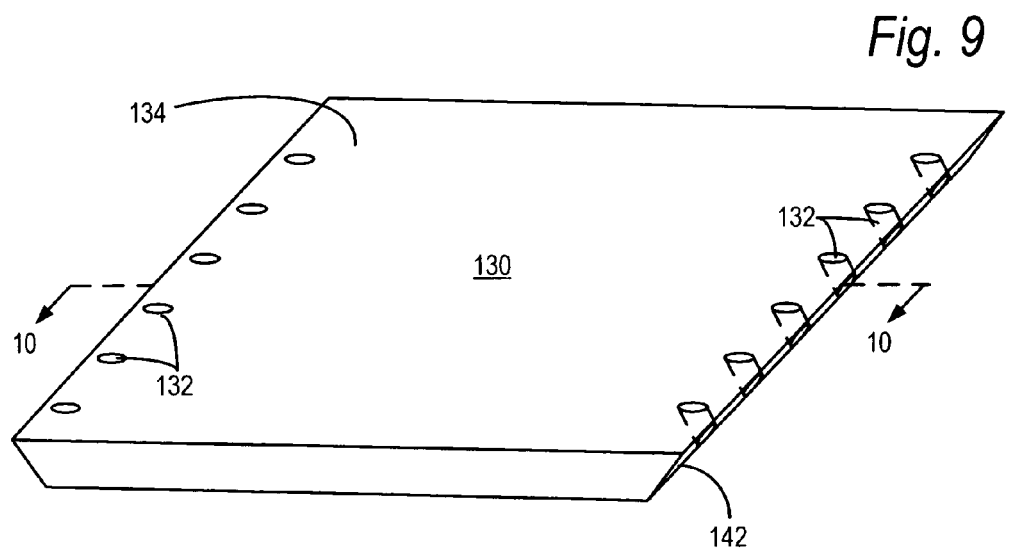
FIG. 9 is a perspective view of a semiconductor package including tapered side edges and holes for affixing a lid onto the semiconductor package.
Figure 10:
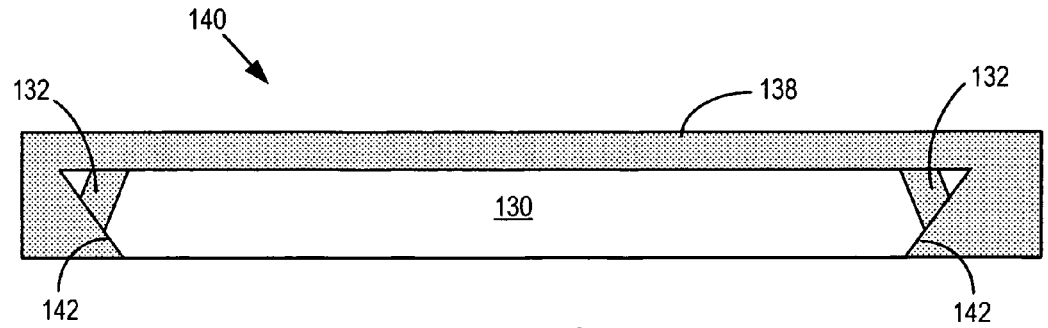
FIG. 10 is a cross-sectional view of the semiconductor package shown in FIG. 9.
Figure 11:
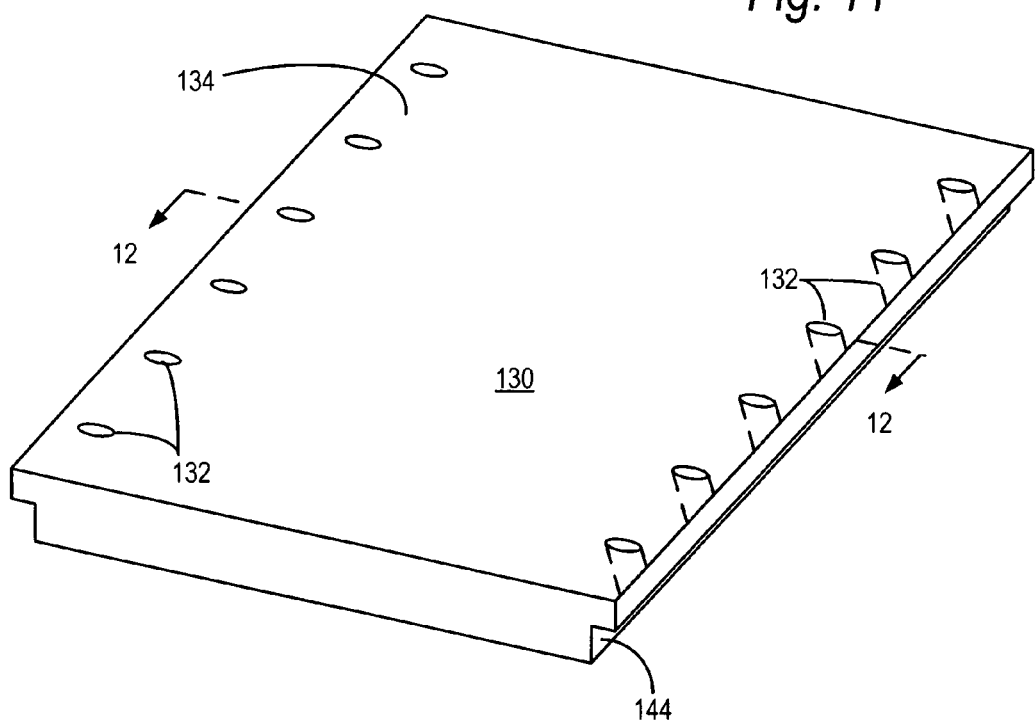
FIG. 11 is a perspective view of a semiconductor package including stepped edges and holes for affixing a cover onto the semiconductor package.
Figure 12:
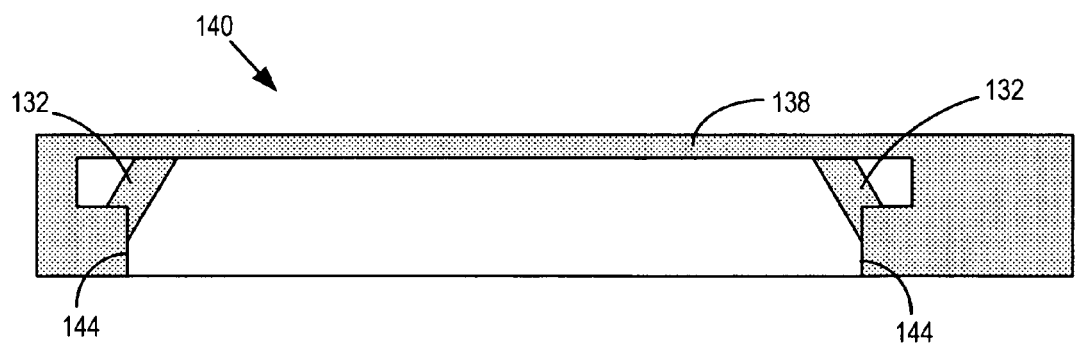
FIG. 12 is a cross-sectional view through the semiconductor package of FIG. 11.

In particular, as shown in FIGS. 9 and 10, the semiconductor package 130 may be formed with tapered edges 142. Holes 132 may be formed through the surface 134 of semiconductor package 130 and out of tapered edges 142. The holes 132 may be as described above. In the embodiments shown in FIGS. 9 and 10, the semiconductor package is a trapezoid in cross-section with the surface 134 having a greater width than its opposed surface. In a further embodiment of the present invention (not shown), instead of being a trapezoid, the tapered edges 142 may be parallel to each other so that semiconductor package 130 forms a parallelogram in cross-section (i.e., the surface 134 has the same width as its opposed surface). In a further embodiment shown in FIGS. 11 and 12, semiconductor package 130 may alternatively include stepped edges 144 including holes 132 as described above. In each of the embodiments shown in FIGS. 9 through 12, the holes 132 and the tapered or stepped edges together operate to securely affix lid 138 to semiconductor package 130.

Lid attachment preparation step 70 may form features on a surface of the molding compound other than holes through molding compound 120 in further embodiments. For example, as shown in FIG. 13, the top surface of semiconductor package 130 may be scored with a laser so as to create rough, pock-marked areas 146 on the surface 136 of the package 130. In particular, a laser may be provided with a known frequency, intensity and focal point so that, when passed over the upper surface of semiconductor package 130, the laser burns into the surface 136 to a desired depth, for example 1 to 10 microns (though it may be more or less than that in alternative embodiments).

As indicated above, molding compound 120 is formed of a variety of compounds, including epoxy, hardener, silicon dioxide and other organic compounds, each of which burns or melts at different temperatures. When the molding compound is scored by the laser, the laser will burn away some of these compounds, such as, for example, the epoxy and organic compounds, while leaving others of the compounds intact. The result is an uneven, rough, pock-marked area 146 as shown for example in FIG. 13.

When the lid 138 is injection molded onto semiconductor package 130, the molten plastic will fill the pockmarks formed by the laser as shown in FIG. 14. The mating interconnection of the molten plastic with each pock-mark 148 affixes the lid 138 to the semiconductor package 130. It is understood that the laser may score the surface of semiconductor package 130 in a variety of patterns to form pockmarks on surface 134 as described above. In embodiments, the entire surface 134 of semiconductor package 130 may be scored with the laser.

Figure 15:
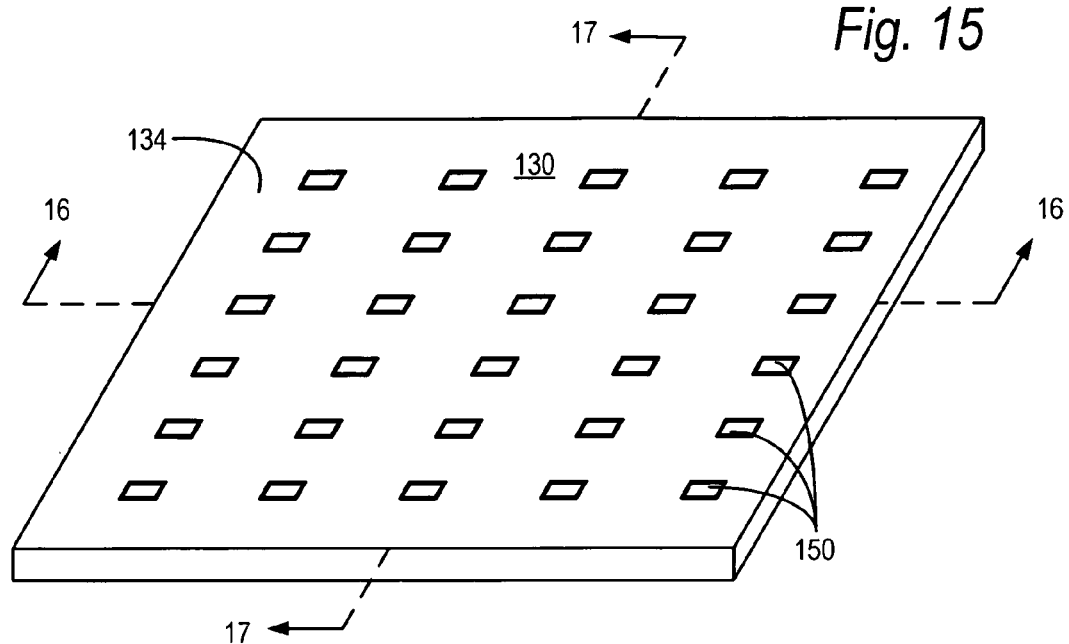
FIG. 15 is a perspective view of a semiconductor package including a plurality of trenches for affixing a lid to the semiconductor package.
Figure 16:
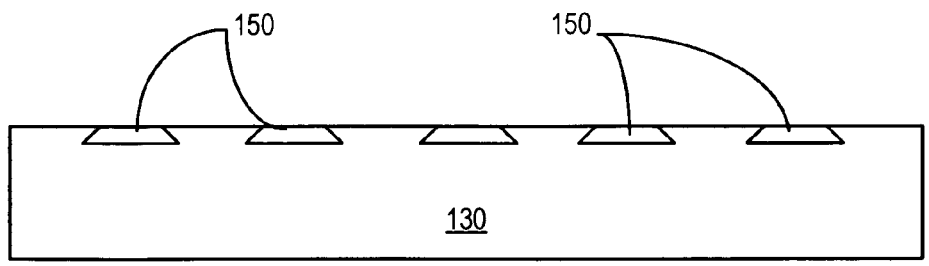
FIG. 16 is a cross-sectional view through line 16-16 in FIG. 15.
Figure 17:
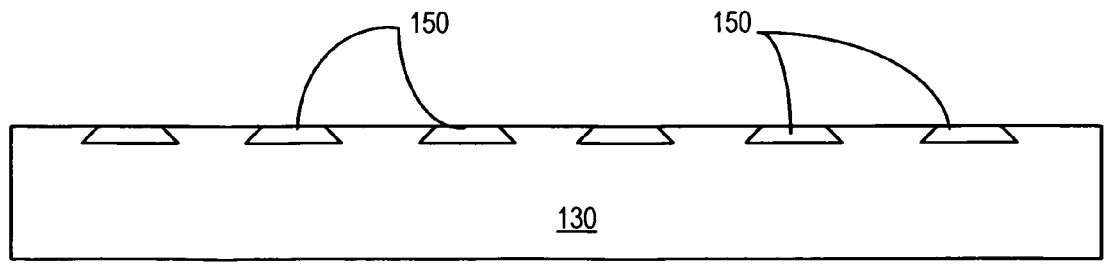
FIG. 17 is a cross-sectional view through line 17-17 in FIG. 15.
Figure 18:
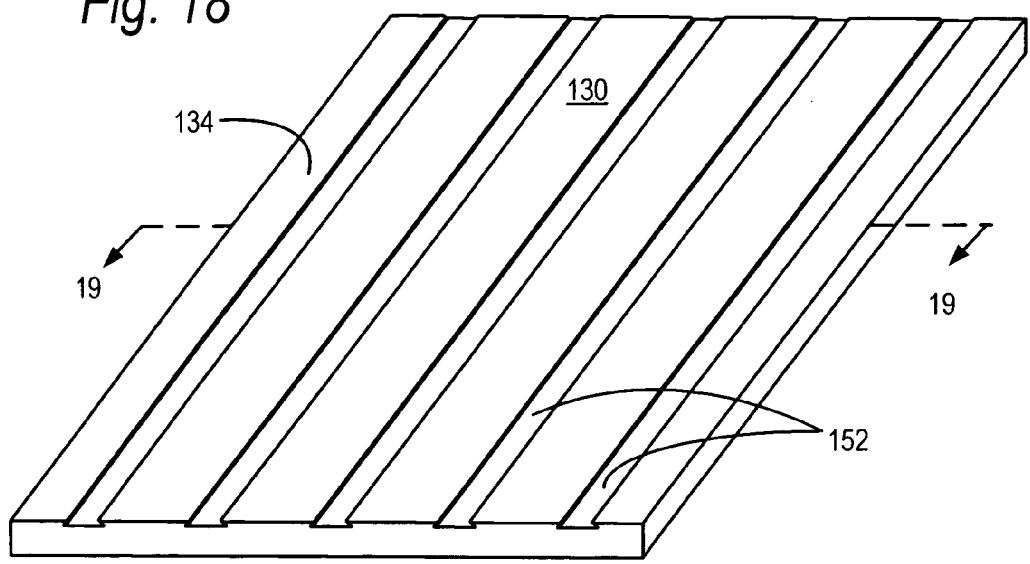
FIG. 18 is a perspective view of a semiconductor package including a plurality of rows of trenches for affixing a lid to the semiconductor package.
Figure 19:
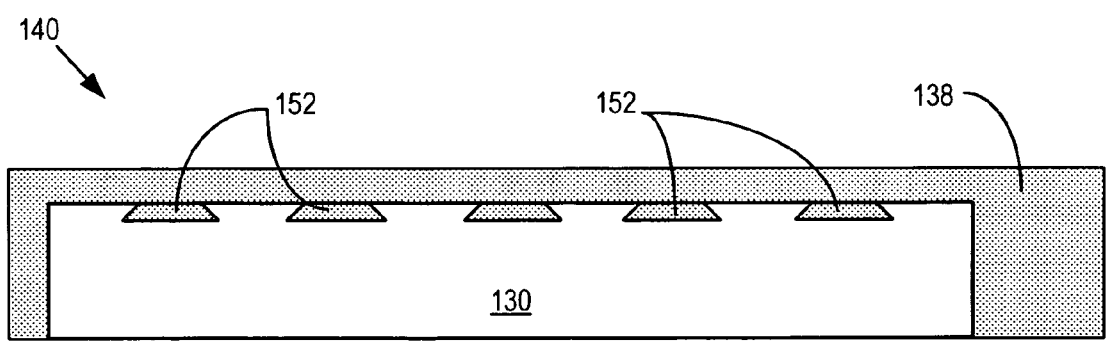
FIG. 19 is a cross-sectional view of the semiconductor package shown in FIG. 18.

In a further embodiment of the present invention shown in FIGS. 15 through 17, the lid attachment preparation step 70 may comprise forming a plurality of trenches 150 in the surface 134 of semiconductor package 130. In embodiments, one or more sidewalls of the trenches 150 may be undercut as shown so as to be wider at the bottom of the trench 150 (i.e., distal from the surface 134) than at the surface 134. Thus, as seen in the cross-sectional views of FIGS. 16 and 17, during the injection molding process, the molten plastic flows into trenches 150, with the undercuts serving to lock the lid to the semiconductor package 130 upon hardening of the molten plastic.

In embodiments, the trenches may be rectangular in shape and may extend approximately one millimeter down into the surface 134 of the semiconductor package 130. It is understood that trenches 150 need not be square in further embodiments, and may be for example rectangular, triangular, rounded or irregular shaped. Additionally, it is understood that the trenches 150 may extend greater than or less than one millimeter down into the surface 134 of molding compound 120, with the provision that the trenches 150 not interfere with the electrical operation of the semiconductor package 130. The length and width of trenches 150 within the surface 134 may vary in alternative embodiments. Where trenches 150 are substantially square, the length of a trench may be for example between 1 millimeter and 10 millimeters, but it is understood that the length may be less than 1 millimeter and greater than 10 millimeters in alternative embodiments.

FIGS. 16 and 17 are cross-sectional views through lines 16-16 and 17-17 on FIG. 15, respectively. As indicated by FIGS. 16 and 17, all four sides of each trench 150 may be undercut as described above. In further embodiments of the present invention, it is understood that one or more sides or portions of a trench 150 may include no undercut, but instead may be a vertical cut or an oppositely inclined cut than the undercut portions of a trench 150.

Undercut trenches 150 may be formed by mounting semiconductor package 130 on a platform of known design. The platform may be controllably tilted at angles about two axes of freedom relative to a cutting laser so as to allow the laser to form the trenches 150 having undercut edges around the periphery of the trench. The intensity, frequency and focal point of the laser may be selected to dig trenches 150 to the desired depth and configuration within the semiconductor package 130. It is understood that other mechanisms may be used to form trenches 150 having undercut edges as described above. As a further example, trenches 150 may be mechanically cut using, for example, a diamond cutting blade or a grinding wheel to form trenches 150 with the desired undercut edges. It is also contemplated that the trenches 150 may be chemically etched.

In the embodiment of FIGS. 15 through 17, trenches 150 are formed as discrete squares or other shapes in the surface 134 of semiconductor package 130. In a further embodiment of the present invention shown in FIGS. 18 and 19, the trenches may instead be formed as rows 152 across the surface 134 of semiconductor package 130. The rows of trenches 152 may be formed in the same manner and configuration as trenches 150, with the exception that they extend across all or a portion of the length or width of the surface 134 of semiconductor package 130. Row trenches 152 may be parallel to each other and may be parallel to respective edges of semiconductor package 130. In a further embodiment, rows 152 need not be parallel to edges of semiconductor package 130 nor to each other. In such embodiments, the rows 152 may randomly cross each other, or may be provided in a cross-hatched pattern in surface 134.

Figure 20:
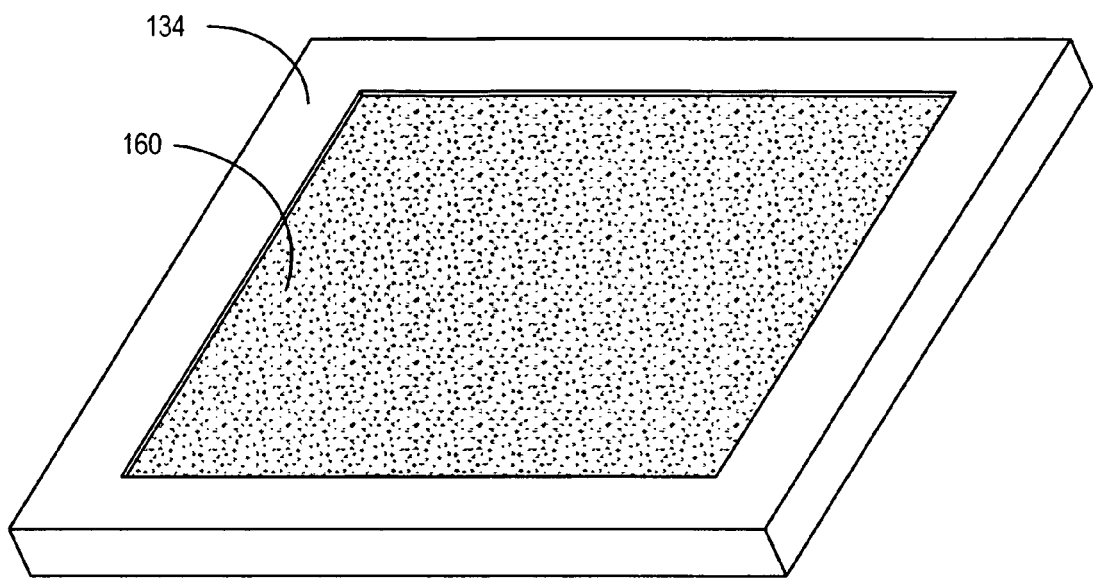
FIG. 20 is a perspective view of a semiconductor package including a layer of compound applied to the semiconductor package for affixing a lid to the semiconductor package.
Figure 21:
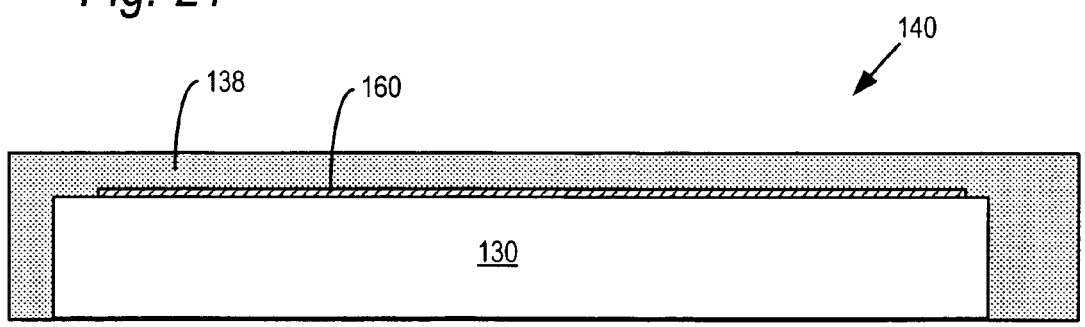
FIG. 21 is a cross-sectional view of the semiconductor package of FIG. 20 and further including a lid.

In a still further embodiment of the present invention, instead of cutting into the surface 134 of semiconductor package 130, a compound may be applied to the surface of semiconductor package 130 capable of affixing the lid 138 to semiconductor package 130. For example, as shown in FIG. 20, a compound 160 may be applied to the surface 134 of semiconductor package 130 in the lid attachment preparation step 70.

Compound 160 may be an adhesive film such as, for example, the thermal adhesive films manufactured by Nitto Denko Corp. of Japan. The compound 160 may alternatively be a glue such as, for example, a polyamide hot-melt adhesive like Euremelt® hot-melt adhesives manufactured by Huntsman Corp. of Salt Lake City, Utah. In a further embodiment, compound 160 may be a heat-activated chemical adhesive such as, for example, a polyurethane-type solvent used in bonding applications.

It is understood that one or more of the embodiments described above with respect to FIGS. 6-21 may be combined with each other to affix the lid 138 to semiconductor package 130.

The memory card 140 formed as described above may have any of a variety of standard card configurations, including for example a Pico card, xD card, an MMC card, an RS-MMC card, an SD Card, a Compact Flash, a Smart Media Card, a Mini SD Card, a Transflash memory card or a Memory Stick. Other devices are contemplated.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor package capable of receiving a lid, the semiconductor package comprising:
    an integrated circuit;
    molding compound for encapsulating the integrated circuit, the molding compound including a top surface and side edges extending at an angle from the top surface, one or more holes formed in the molding compound, the one or more holes having a first end open to the top surface of the molding compound and a second end open to one or more of the side edges of the molding compound; and
    molten material forming a lid for the semiconductor package upon hardening, the molten material applied around the molding compound, the molten material flowing into the one or more holes, and the molten material within the one or more holes interlocking the lid onto the molding compound and securing the lid onto the molding compound upon hardening of the molten material.

2. A semiconductor package as recited in claim 1, wherein the one or more holes are formed at an oblique angle through the surface of the molding compound.

3. A semiconductor package as recited in claim 1, wherein the one or more holes are circular.

4. A semiconductor package as recited in claim 1, wherein the one or more holes comprise a plurality of holes having a diameter of approximately 0.25 millimeters and which are spaced from each other approximately 1 millimeter along the edge between the surface and the adjacent side edge.

5. A semiconductor package as recited in claim 1, wherein the surface of the molding compound includes four edges, the one or more holes being formed at two of said four edges.

6. A semiconductor package as recited in claim 1, wherein the surface of the molding compound includes four edges, the one or more holes being formed at three of said four edges.

7. A semiconductor package as recited in claim 1, wherein the surface of the molding compound includes four edges, the one or more holes being formed at four of said four edges.

8. A flash memory card, comprising:
    a semiconductor package, including:
        an integrated circuit, and
        molding compound for encapsulating the integrated circuit, the molding compound including a top surface and side edges extending at an angle from the top surface, one or more holes formed in the molding compound, the one or more holes having a first end open to the top surface of the molding compound and a second end open to one or more of the side edges of the molding compound; and
    a lid covering the semiconductor package, the lid having portions extending through the one or more holes to permanently interlock and secure the lid to the molding compound.

9. A flash memory card as recited in claim 8, wherein the flash memory card is one of a Pico card, xD card, an MMC card, an RS-MMC card, an SD Card, a Compact Flash, a Smart Media Card, a Mini SD Card, a Transflash memory card or a Memory Stick.

* * * * *

UNITED STATES PATENT AND TRADEMARK OFFICE
CERTIFICATE OF CORRECTION

PATENT NO. : 7,615,861 B2 Page 1 of 1
APPLICATION NO. : 11/373941
DATED : November 10, 2009
INVENTOR(S) : Chang et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 266 days.

Signed and Sealed this

Nineteenth Day of October, 2010

David J. Kappos
*Director of the United States Patent and Trademark Office*